United States Patent [19]

Chen et al.

[11] 4,303,411
[45] Dec. 1, 1981

[54] FLUORINE-CONTAINING TRACERS FOR SUBTERRANEAN PETROLEUM AND MINERAL CONTAINING FORMATIONS

[75] Inventors: Catherine S. H. Chen, Berkeley Heights; Yuhshi Luh, Trenton; Kirk D. Schmitt, Pennington, all of N.J.

[73] Assignee: Mobil Oil Corporation, New York, N.Y.

[21] Appl. No.: 221,608

[22] Filed: Dec. 31, 1980

[51] Int. Cl.³ ............................................. G01N 24/08
[52] U.S. Cl. ................................. 23/230 EP; 166/252
[58] Field of Search .......................... 23/230 EP, 230.3; 166/252, 250; 324/307; 367/25, 33; 364/422; 422/54; 250/259

[56] References Cited

U.S. PATENT DOCUMENTS

| | | | |
|---|---|---|---|
| 2,553,900 | 5/1951 | Doan et al. | 166/252 |
| 3,435,672 | 4/1969 | Brink et al. | 23/230 EP X |
| 3,740,641 | 6/1973 | Hwang et al. | 23/230 EP X |
| 4,022,276 | 5/1977 | Dreher et al. | 166/252 X |

FOREIGN PATENT DOCUMENTS 591755  1/1978  U.S.S.R. ............................. 324/307

*Primary Examiner*—Kenneth M. Schor
*Attorney, Agent, or Firm*—Charles A. Huggett; Michael G. Gilman; Hastings S. Trigg

[57] ABSTRACT

There is disclosed a method for determining flow patterns within a subterranean formation by injecting as a tracer a water soluble alkaline metal salt of inorganic or organic compounds having fluorine in the anion. The tracer compounds of the invention are identified by FNMR spectroscopy.

3 Claims, No Drawings

FLUORINE-CONTAINING TRACERS FOR SUBTERRANEAN PETROLEUM AND MINERAL CONTAINING FORMATIONS

BACKGROUND OF THE INVENTION

1. Field of the Invention

This invention is directed to novel tracers for the determination of flow patterns in subterranean formations.

2. Description of the Prior Art

In recovery of petroleum or minerals from subterranean formations, especially by chemical flooding, one must be knowledgeable about the flow patterns of the formation prior to injection of chemicals. Tracers are used in such reservoir engineering. In the actual recovery process, during chemical injections, it is advantageous to follow the flow of each slug by using a tracer in the slug. Ideally, a tracer should be water soluble and inert to the solids and liquids in the formations. By inert is meant that it does not get absorbed onto the rocks; it does not partition into the oil phase; and it does not interact with the organics and minerals present in the formations. When injected with a chemical, it should also be inert to the chemical it is injected with. A tracer should also be easily and accurately detected by methods which are not interfered by any substance present in the connate fluids.

The tracers now employed are radioactive isotopes and compounds like potassium iodide, ammonium thiocyanate and dichromate. Radioactive isotopes are expensive and require special handling by licensed personnel. Potasium iodide and alike are detected by wet analyses and, therefore, bear the limitations of such analyses.

SUMMARY OF THE INVENTION

The method for determining flow patterns within a subterranean formation penetrated by a spaced apart injection system and production system that comprises injecting into the formation at a predetermined depth from the injection system a saline solution containing a small amount of one or more water-soluble tracer compounds, recovering said saline solution in the production system, determining the depth of recovery, and identifying said tracer compounds by $^{19}$FNMR spectroscopy; said tracer compunds being water-soluble alkali metal salts of inorganic or organic compounds having fluorine in the anion.

DESCRIPTION OF SPECIFIC EMBODIMENTS

The method of this invention is applicable to determine flow patterns in any subterranean formation from which petroleum, including tar sands, or minerals are to be recovered, as by chemical flooding.

The present invention is carried out in a subterranean formation that is penetrated by spaced apart injection and production systems extending from the surface of the earth into the formation. The injection system consists of one or more wells into which are introduced fluids. The production system comprises one or more wells from which product is recovered. The wells in the injection and production systems are spaced apart and can be arranged in any desired pattern, such as patterns well known in waterflood operations. For example, the pattern can comprise a central injection well and a plurality of recovery wells spaced radially about the injection well.

In carrying out the invention, a saline solution containing a small amount of one or more water-soluble tracer compounds, defined hereinafter, is injected into the formation at a predetermined depth in the injection system. Injection is via a perforation through the casing of the injection well. As the saline solution travels through the formation and reaches the production system, it is recovered in a production well and the depth at which recovery is made is determined. The solution is identified by identifying the tracer compounds by $^{19}$FNMR spectroscopy. An ideal source of the saline solution or brine is connate water previously obtained in production from the formation.

The tracers used in the method of this invention are not absorbed on the rocks; do not partition into the oil phase; and do not interact with the organics and minerals present in the formation. These tracers are water-soluble alkali metal salts of inorganic or organic acids having fluorine in the anion. Examples of utilizable salts are lithium hexafluorosilicate, lithium fluorosulfonate, sodium monofluroroacetate, sodium trifluoroacetate, sodium 3-fluoropropionate, sodium hexafluorophosphate, sodium hexafluoroarsenate, sodium hexafluorosilicate, sodium hexafluorozirconate, sodium fluorosulfonate, potassium monofluoroacetate, potassium trifluoroacetate, potassium 3-fluoropropionate, potassium hexafluorophosphate, potassium hexafluoroarsenate, potassium hexafluorosilicate, potassium hexafluorozirconate, potassium fluorosulfonate, rubidium hexafluorosilicate, rubidium fluorosulfoate, cesium hexafluorosilicate, and cesium fluorosulfonate.

The amount of tracer compound used is small. In general, concentrations can range between about 3 ppm and about 10,000 ppm. At 3 ppm, detection by $^{19}$FNMR spectroscopy is possible, but the determination takes a number of hours. At 1,000 ppm, accurate determination can be made in seconds. Preferred concentrations are between about 300 ppm and 2,000 ppm. The use of mixtures of tracer compounds is contemplated.

The feasibility of the method of this invention is demonstrated in the following examples. The core samples used were obtained from the West Burburnett field in Texas, a typical sandstone type of formation. The tracers also work as effectively in carbonate reservoirs.

EXAMPLE 1

$^{19}$FNMR spectra were made of potassium hexafluorophosphate at 1,000 ppm and 3 ppm in West Burkburnett produced brine using sodium trifluoroacetate, $CF_3CO_2Na$, as the internal standard. At 1,000 ppm, accurate determination can be made in seconds. At 3 ppm, determination requires 16 hours, however, its determinability is clearly shown. West Burkburnett connate water does not contain any substance which interferes with the tracer determination as shown by its spectrum.

EXAMPLE 2

Through a West Burkburnett cleaned-up core plug, one inch in diameter and three inches in length held by a Hassler cell, was pumped West Burkburnett produced brine until saturation. A 1,000 ppm potassium hexafluorophosphate solution in West Burkburnett produced brine was then pumped through at 2.4 ml/hour. The effluent was collected in 2 ml fractions and analyzed by the $^{19}$FNMR technique. After the effluent reached 1,000 ppm concentration, West Burkburnett produced brine was then pumped through and collected in 2 ml fractions until no more tracer was detected by $^{19}$FNMR. The results are summarized in Table I and based on the material balance, within experimental error no tracer was absorbed by this core.

TABLE I

DATA AND MATERIAL BALANCE WHEN 1000 ppm $KPF_6$ IN WEST BURKBURNETT BRINE WAS PUMPED THROUGH A WEST BURKBURNETT CORE PLUG

| Solution In | Vol., ml | ppm $KPF_6$ In Effluent | Cumulative Vol., ml |
|---|---|---|---|
| 1000 ppm $KPF_6$ in brine | 6.5 | 60 | 6.5 |
| | 2.0 | 480 | 8.5 |
| | 2.0 | 760 | 10.5 |
| | 2.0 | 940 | 12.5 |
| | 2.0 | 940 | 14.5 |
| | 2.0 | 980 | 16.5 |
| | 2.0 | 960 | 18.5 |
| | | | Total ppm × ml = 10510 |
| Brine | 2.0 | 960 | 2.0 |
| | 2.0 | 960 | 4.0 |
| | 2.0 | 1000 | 6.0 |
| | 2.1 | 630 | 8.1 |
| | 2.1 | 340 | 10.2 |
| | 1.8 | 180 | 12.0 |
| | 2.1 | 98 | 14.1 |
| | 2.1 | 0 | 16.2 |
| | 2.0 | 0 | 18.2 |
| | | | Total ppm × ml = 8406.8 |

Material Balance: 18.5 × 1000 − (10510 + 8406.8) = −416.2 ppm × ml, or 102% of what was put on, came off.

EXAMPLE 3

The same experiment was performed as described in Example 2, except a West Burkburnett live core plug containing about 35% oil (65% brine) was used instead of a cleaned-up core. The results are summarized in Table II. Based on these results and within experimental error, it is concluded that the tracer is not lost by partitioning into the oil phase, nor is it lost by absorption onto the core material.

TABLE II

DATA AND MATERIAL BALANCE WHEN 1000 ppm $KPF_6$ IN WEST BURKBURNETT BRINE WAS PUMPED THROUGH A WEST BURKBURNETT LIVE CORE PLUG CONTAINING OIL

| Solution In | Vol., ml | ppm $KPF_6$ In Effluent | Cumulative Vol., ml |
|---|---|---|---|
| 1000 ppm $KPF_6$ In Brine | 200 | 0 | 200 |
| | 2.0 | 0 | 4.0 |
| | 1.9 | 60 | 5.9 |
| | 1.9 | 250 | 7.8 |
| | 2.1 | 750 | 9.9 |
| | 2.2 | 1040 | 12.1 |
| | | | Total ppm × ml = 4452.0 |
| Brine | 2.0 | 960 | 2.0 |
| | 2.0 | 960 | 4.0 |
| | 1.4 | 990 | 7.4 |
| | 2.6 | 890 | 10.0 |
| | 1.9 | 350 | 11.9 |
| | 1.9 | 170 | 13.8 |
| | 2.0 | 120 | 15.8 |
| | 2.0 | 30 | 17.8 |
| | | | Total ppm × ml = 8828.0 |

Material Balance: 12.1 × 1000 − (4452.0 + 8828.0) = −1180 ppm × ml or 110% of what was put on came off.

EXAMPLE 4

This example demonstrates that (1) a small amount of tracer is effective, making the process more economical, and (2) more than one tracer can be used and detected simultaneously. Into the same live core in Example II was pumped a slug of a brine solution containing 500 ppm of $KPF_6$ and 260 ppm of $CF_3CO_2Na$. The slug was followed by the plain brine solution until neither tracer was detected. The concentrations of both tracers were detected simultaneously by $^{19}$FNMR using tribluoroacetophenone, $CF_3C(O)Ph$, as an external standard. A spectrum containing both tracers and the standard is shown in FIG. 4. The core displacement results are summarized in Table III. These results again indicated that the tracers are inert to absorption onto the core, partition into the oil, and chemical reactions with other materials present in the core.

TABLE III

DATA AND MATERIAL BALANCE USING TWO TRACERS $KPF_6$ AND $CF_3CO_2NA$ SIMULTANEOUSLY

| Solution In | Vol., ml | ppm Tracer in Effluent | | Cumulative Vol., ml |
|---|---|---|---|---|
| | | $KPF_6$ | $CF_3CO_2Na$ | |
| 500 ppm $KPF_6$ + 260 ppm $CF_3CO_2Na$ In Brine | 1.41 | 0 | 0 | 1.41 |
| | 1.87 | 0 | 0 | 3.28 |
| Brine | 1.65 | 0 | 0 | 1.65 |
| | 1.84 | 62 | 57 | 3.49 |
| | 1.86 | 209 | 121 | 5.35 |
| | 1.88 | 286 | 142 | 7.23 |
| | 1.86 | 157 | 119 | 9.09 |
| | 1.88 | 89 | 56 | 10.97 |
| | 1.89 | 55 | 22 | 12.86 |
| | 1.88 | 0 | 0 | 14.74 |
| | | | | Total ppm × ml: $KPF_6$ = 1604 $CF_3CO_2Na$ = 965 |

Material Balance:
$KPF_6$: 3.28 × 500 − 1604 = 1640 − 1604 = 36 ppm × ml or 98%
$CF_3CO_2Na$: 3.28 × 260 − 965 = 853 − 965 = −112 ppm × ml or 113%

Although the present invention has been described with preferred embodiments, it is to be understood that modifications and variations may be resorted to, without departing from the spirit and scope of this invention, as those skilled in the art will readily understand. Such modifications and variations are considered to be within the purview and scope of the appended claims.

What is claimed is:

1. The method for determining flow patterns within a subterranean formation penetrated by a spaced apart injection system and production system that comprises injecting into the formation at a predetermined depth from the injection system a saline solution containing a small amount of one or more water-soluble tracer compounds, recovering said saline solution in the production system, determining the depth of recovery, and identifying said tracer compounds by $^{19}$FNMR spectroscopy; said tracer compounds being water-soluble alkali metal salts of inorganic or organic compounds having fluorine in the anion.

2. The method of claim 1, wherein said tracer is potassium hexafluorophosphate.

3. The method of claim 1, wherein said tracer is a mixture of potassium hexafluorophosphate and sodium trifluoroacetate.

* * * * *